(12) United States Patent
Su et al.

(10) Patent No.: US 11,749,735 B2
(45) Date of Patent: Sep. 5, 2023

(54) METHOD FOR FORMING SHIELDING POLYSILICON SIDEWALL FOR PROTECTING SHIELDED GATE TRENCH METAL-OXIDE-SEMICONDUCTOR FIELD EFFECT TRANSISTOR

(71) Applicant: Nanjing Zizhu Microelectronics Co., Ltd., Nanjing (CN)

(72) Inventors: Yi Su, Cupertino, CA (US); Hong Chang, Saratoga, CA (US)

(73) Assignee: HUAYI MICROELECTRONICS CO., LTD., Xi'an (CN)

( * ) Notice: Subject to any disclaimer, the term of this patent is extended or adjusted under 35 U.S.C. 154(b) by 27 days.

(21) Appl. No.: 17/146,348

(22) Filed: Jan. 11, 2021

(65) Prior Publication Data

US 2022/0223703 A1     Jul. 14, 2022

(51) Int. Cl.
  *H01L 29/423*   (2006.01)
  *H01L 29/06*    (2006.01)
  *H01L 29/10*    (2006.01)
  *H01L 29/66*    (2006.01)
  *H01L 29/78*    (2006.01)

(52) U.S. Cl.
  CPC ...... *H01L 29/4236* (2013.01); *H01L 29/0623* (2013.01); *H01L 29/1083* (2013.01); *H01L 29/66734* (2013.01); *H01L 29/7813* (2013.01)

(58) Field of Classification Search
  CPC ............. H01L 29/4236; H01L 29/0623; H01L 29/1083; H01L 29/66734; H01L 29/7813; H01L 29/1095; H01L 29/407; H01L 29/66727
  See application file for complete search history.

(56) References Cited

U.S. PATENT DOCUMENTS

2021/0273092 A1*  9/2021  Xiao ................... H01L 29/1095
2022/0157958 A1*  5/2022  Lin .................... H01L 29/66734

* cited by examiner

*Primary Examiner* — Shahed Ahmed
*Assistant Examiner* — Khatib A Rahman

(57) ABSTRACT

The present application provides a method for forming a sidewall protection layer in a heavily N-type doped shielding polysilicon for reducing gate to source leakage in a shielded gate trench metal-oxide-semiconductor field effect transistor (SGT MOSFET). In the process of forming a shielding polysilicon sidewall is manufactured by using a secondary oxidation layer forming process, so as to increase a thickness of an oxide in a top region of the shielding polysilicon and a thickness of an oxide of a trench sidewall in a transition region between the shielding polysilicon and an N-type doped gate polysilicon to solve the problem of serious gate to source leakage current.

13 Claims, 22 Drawing Sheets

METHOD FOR FORMING SHIELDING POLYSILICON SIDEWALL FOR PROTECTING SHIELDED GATE TRENCH METAL-OXIDE-SEMICONDUCTOR FIELD EFFECT TRANSISTOR

CROSS-REFERENCE TO RELATED APPLICATION

This application claims priority from the Chinese patent application 201910765715.9 filed Mar. 19, 2019, the content of which is incorporated herein in the entirety by reference.

TECHNICAL FIELD

The present invention relates to a method for forming a shielding polysilicon sidewall protection layer for a shielded gate trench metal-oxide-semiconductor field effect transistor (SGT MOSFET).

BACKGROUND

When a thermal oxide is used for an inter-polysilicon oxide (IPO) layer of a shielded gate trench metal-oxide-semiconductor field effect transistor (SGT MOSFET), a gate-to-source leakage current (Igss) from a gate to a source is usually very high and a drain-to-source leakage current (Idss) from a drain to the source also becomes high because a thickness of an oxide in a top region of shielding polysilicon (Poly1) and a thickness of an oxide of a trench sidewall in a transition region between the shielding polysilicon and gate polysilicon become thin.

SUMMARY

The present application provides a method for forming a shielding polysilicon sidewall protection layer for protecting an SGT MOSFET, so as to increase a thickness of an oxide in a top region of shielding polysilicon and a thickness of an oxide of a trench sidewall in a transition region between the shielding polysilicon and gate polysilicon to solve the problem of serious leakage current.

An objective of the present application and the solving of the technical problem are implemented by adopting the following technical solutions.

A method for forming a shielding polysilicon sidewall protection layer for protecting an SGT MOSFET according to the present application includes: forming an epitaxial layer on a semiconductor substrate and forming a trench on a surface of the semiconductor substrate; forming a liner oxide layer on an inner wall of the trench; arranging heavily in situ N-type doped (doping level>2e20/cm$^3$) shielding polysilicon in the trench, forming a transition oxide protection layer on a surface of the shielding polysilicon; the liner oxide layer and the transition oxide protection layer from a top and sidewall surface of the shielding polysilicon; forming an inter-polysilicon oxide (IPO) layer on the top surface of the shielding polysilicon, the inner sidewall of the trench; and forming N-type doped gate polysilicon above the shielding polysilicon, the gate polysilicon being isolated from the shielding polysilicon through the IPO layer.

In the present application, the following technical measures may be further adopted to solve the technical problem.

In an embodiment of the present application, an oxide layer—silicon-nitrogen compound—oxide layer as a hard mask layer is formed on a semiconductor substrate, and then the trench is etched on the semiconductor substrate from the patterned hard mask layer; the liner oxide layer is grown or deposited in the trench; in situ heavily N-type doped (doping level>2e20/cm$^3$) polysilicon layer is deposited and etched back in the trench; the liner oxide layer is partially removed in the trench; a transition oxide protection layer is grown on the top and sidewall surface of the shielding polysilicon.

In an embodiment of the present application, when the heavily N-type doped (doping level>2e20/cm$^3$) shielding polysilicon is arranged in the trench, and the heavily N-type doped polysilicon is etched back to retain some materials to form the shielding polysilicon.

In an embodiment of the present application, the oxide-nitride hard mask layer, the liner oxide layer and the transition oxide layer on the top surface of the shielding polysilicon are removed by reactive ion dry etching or an HF based wet etching technique.

In an embodiment of the present application, thicknesses of the transition oxide layer and the liner oxide layer are the same or different.

In an embodiment of the present application, the liner oxide layer for the protective heavily N-type doped shielding polysilicon sidewall is makeable by using a thermal oxidation process or thermal oxidation and a chemical vapor deposition process.

In an embodiment of the present application, the IPO layer is composed of a thermal oxide layer or a thermal oxide layer and a chemical vapor deposition oxide layer or a high-density plasma deposition oxide layer or a nitride layer mixed with a thermal oxide layer or a single nitride layer or a low-K dielectric layer.

In an embodiment of the present application, the liner oxide layer of the protective shielding polysilicon sidewall is located between the heavily N-type doped shielding polysilicon and the trench sidewall, and the IPO layer of the protected shielding polysilicon sidewall is located between the shielding polysilicon sidewall and the gate polysilicon, including: a first distance and a second distance, wherein the IPO layer further comprises a termination region and a core cell active region.

A thickness of the IPO layer with the second distance in the termination region is greater than a thickness of the IPO layer with the first distance in the core cell active region.

The IPO layer is makeable by using the chemical vapor deposition process, and the thickness of the IPO layer with the second distance in the termination region or a thickness of the shielding polysilicon contact to a source metal region is 1000 Å to 3.0 μm.

The IPO layer is makeable by using the thermal oxidation process, and the thickness of the IPO layer with the first distance in the core cell active region is 1000 Å to 4000 Å.

The shielding polysilicon is extensible to the top semiconductor surface of the substrate in the termination trench.

A thickness of the liner oxide layer in the termination trench is 1000 Å to 3.0 μm.

In an embodiment of the present application, the method further includes: forming a P-type doped body implantation layer and a heavily N-type doped source implantation layer on the surface of the semiconductor substrate; forming an LTO/boron-phosphorosilicate glass (BPSG) oxide layer on a surface of the semiconductor substrate; defining a contact window on a surface of the LTO/BPSG oxide layer; forming a contact on the BPSG oxide layer by removing LTO/BPSG oxide at the contact region, source metal in contact with a source.

In an embodiment of the present application, according to the method for forming a shielding polysilicon sidewall for protecting an SGT MOSFET, P-body implantation may be performed in the termination region.

In an embodiment of the present application, according to the method for forming a shielding polysilicon sidewall for protecting an SGT MOSFET, after P-body implantation is performed in the active region, it is necessary to add a trench guard ring to reduce drain-to-source electric leakage. In some embodiments, for a MOSFET device with a breakdown voltage less than 80 V, it is unnecessary to add a trench 14 guard ring to reduce drain-to-source electric leakage. For a MOSFET device with a breakdown voltage greater than 80 V, it is necessary to add a trench 14 floating guard ring to reduce drain-to-source electric leakage.

In an embodiment of the present application, according to the method for forming a shielding polysilicon sidewall for protecting an SGT MOSFET, P-body implantation is not performed in the termination region for a full charge balanced SGT MOSFET, it is unnecessary to add a trench guard ring to reduce drain-to-source electric leakage.

In an embodiment of the present application, according to the method for forming a shielding polysilicon sidewall for protecting an SGT MOSFET, a breakdown voltage executed on the SGT MOSFET is between 10 V and 300 V.

DESCRIPTION OF REFERENCE NUMERALS

Figure 1:
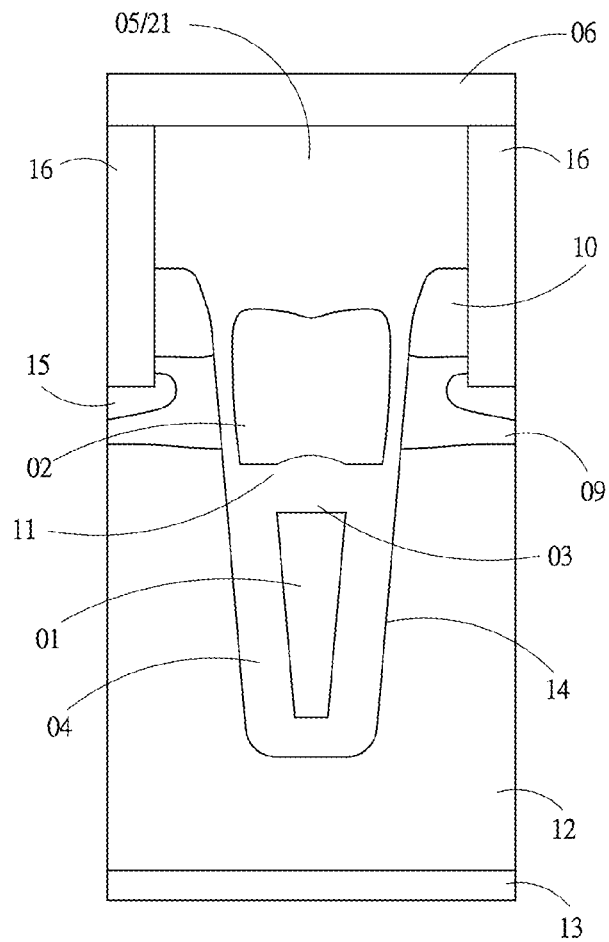
FIG. 1 is a schematic diagram of a protected SGT MOSFET structure according to an embodiment of the present application.

01: shielding polysilicon (Poly1); 02: gate polysilicon (Poly2); 03: transition oxide layer; 04: liner oxide layer; 05: boron-phosphorosilicate glass (BPSG); 06: source metal; 07: semiconductor substrate; 08*a*: hard mask layer; 08*b*: hard mask layer; 09: P-body implantation layer; 10: source implantation layer (N+); 11: inter poly oxide (IPO) layer; 12: N-type Epi layer; 13: N+ substrate; 14: trench; 15: P+ contact implantation; 16: source contact; 17: first distance (d1); 18: second distance (d2); 19: core cell active region; 20: termination region; 21: low temperature oxide (LTO)/BPSG oxide layer; 22: source contact window

DETAILED DESCRIPTION

The following embodiments are described with reference to the accompanying drawings to illustrate, by way of examples, specific embodiments that the present invention can implement. Directional terms mentioned in the present invention, such as "upper", "lower", "front", "rear", "left", "right", "inner", "outer" and "side" only indicate the directions of the accompanying drawings. Therefore, the directional terms are intended to illustrate and help understand the present invention, but not limit the present invention.

The accompanying drawings and description are regarded as illustrative but not limitative in nature. In the drawings, elements with similar structures are denoted by the same reference numerals. In addition, for understanding and ease of description, the size and thickness of each component shown in the accompanying drawings are arbitrarily shown, but the present invention is not limited thereto.

In the accompanying drawings, the configuration ranges of devices, systems, components and circuits are exaggerated for clarity, understanding and ease of description. It should be understood that when a component is referred to as "on" another component, the component may be directly on another component, or an intermediate component may be present.

In addition, in the specification, unless explicitly described as otherwise, the word "including" shall be understood as including the stated component, but not excluding any other component. In addition, in the specification, "on . . . " means being located above or below a target component, but not having to be located on top based on the gravity direction.

To further illustrate the technical means and effects adopted by the present invention to achieve the intended objectives of the present invention, the following describes in detail, with reference to the accompanying drawings and specific embodiments, specific implementations, structures, features and effects of a method for forming a shielding polysilicon sidewall for protecting an SGT MOSFET according to the present invention.

FIG. 1 is a schematic diagram of an SGT MOSFET structure according to an embodiment of the present application. This embodiment is understood in combination with FIG. 1. Shielding polysilicon 01 is included in a trench 14, and gate polysilicon 02 is located above the shielding polysilicon 01 and spaced from the shielding polysilicon 01 by an IPO layer 11. On a side of the shielding polysilicon 01, there is mainly a liner oxide layer 04, while above the shielding polysilicon 01, there is mainly a thermal oxide layer 03. The top of the gate polysilicon 02 is covered by an LTO 21 and a BPSG 05, and the top and a periphery of the BPSG 05 are covered by metal layer 06.

FIG. 2A to FIG. 2G are schematic diagrams of step processes of a method for forming a shielding polysilicon sidewall for protecting an SGT MOSFET according to an embodiment of the present application. The method includes at least the following steps.

Figure 2A:
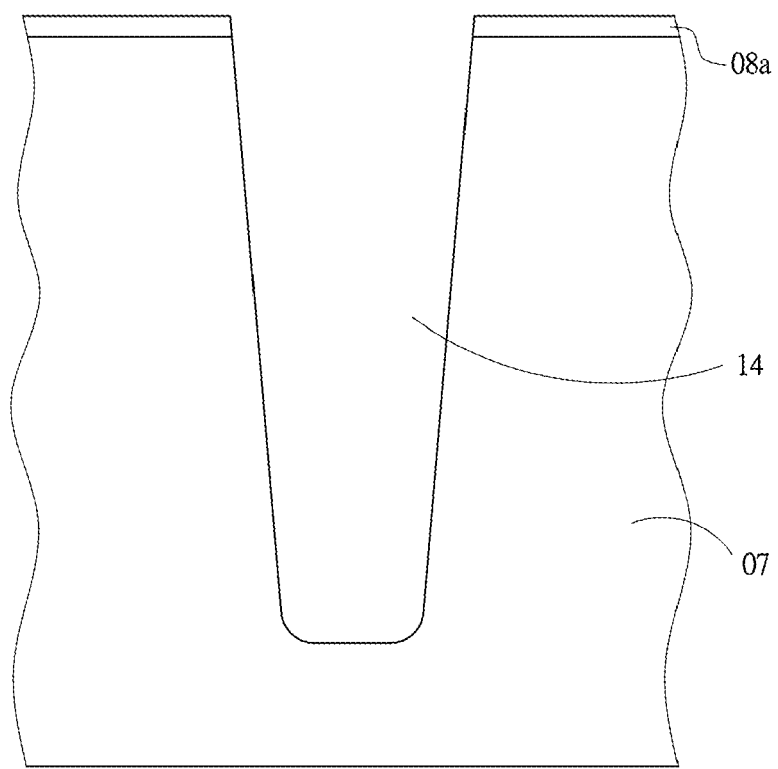
FIG. 2A shows a first step process of a method for forming a shielding polysilicon sidewall for protecting an SGT MOSFET according to an embodiment of the present application.

As shown in FIG. 2A, a hard mask layer 08a is formed on a heavily N-type doped semiconductor substrate with an N-type epitaxial 07 and the trench 14 is formed on a surface of the semiconductor substrate. In some embodiments, the hard mask layer 08a is an oxide layer, and the trench 14 is formed on the surface of the semiconductor substrate by reactive ion plasma dry etching.

Figure 2B:
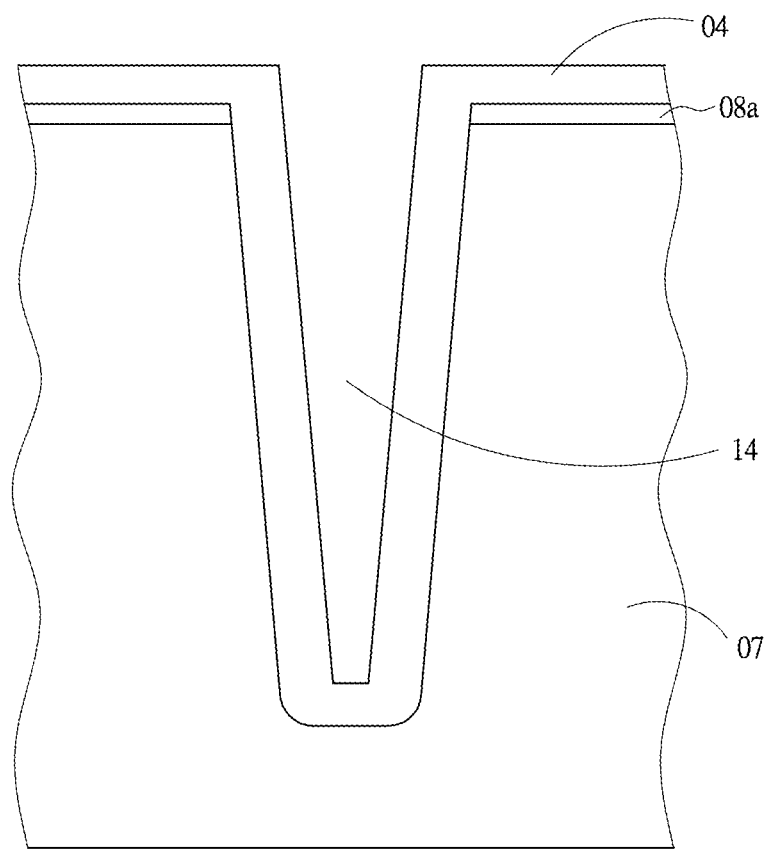
FIG. 2B shows a second step process of a method for forming a shielding polysilicon sidewall for protecting an SGT MOSFET according to an embodiment of the present application.

As shown in FIG. 2B, the liner oxide layer 04 is formed on an inner wall of the trench 14. In some embodiments, the liner oxide layer 04 may be formed by thermal oxidation or chemical vapor deposition, so that the sidewall of the whole trench 14 and a surface of the hard mask layer 08a are covered by the liner oxide layer 04.

Figure 2C:
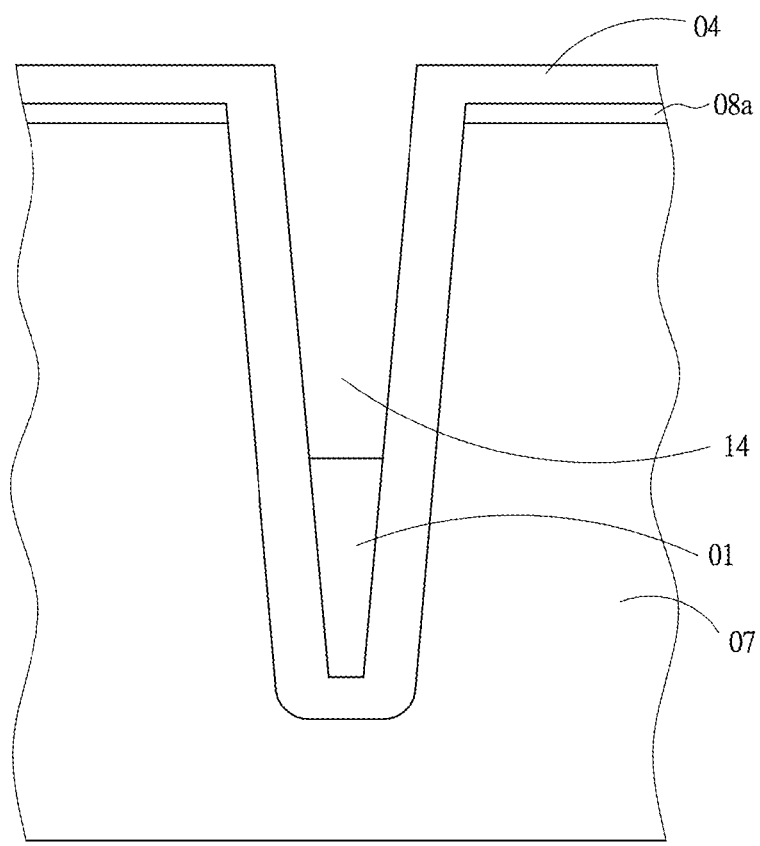
FIG. 2C shows a third step process of a method for forming a shielding polysilicon sidewall for protecting an SGT MOSFET according to an embodiment of the present application.

As shown in FIG. 2C, the heavily N-type doped (doping level>2e20 $cm^3$) shielding polysilicon 01 is arranged in the trench 14. In some embodiments, a heavily situ doped polysilicon layer is deposited in the trench 14 by chemical vapor deposition to form the shielding polysilicon 01, and then the shielding polysilicon 01 is etched back, so that the shielding polysilicon 01 from the middle of the trench to the bottom of the trench is retained in the trench, leaving part of space in the trench exposed to air to form an opening.

Figure 2D:
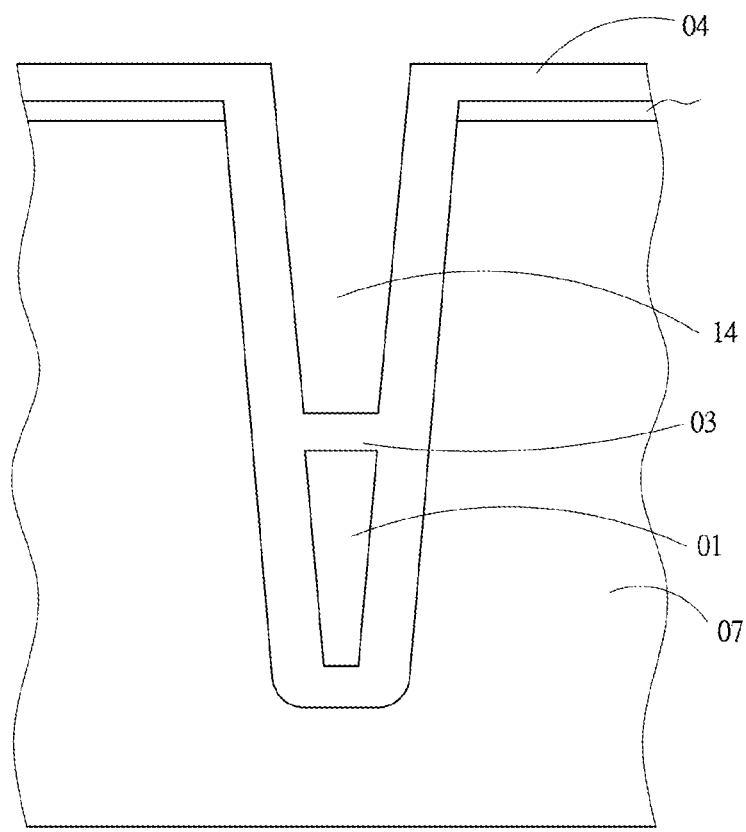
FIG. 2D shows a fourth step process of a method for forming a shielding polysilicon sidewall for protecting an SGT MOSFET according to an embodiment of the present application.

As shown in FIG. 2D, a transition oxide layer 03 is formed on a top and sidewall surface of the heavily doped shielding polysilicon 01. In some embodiments, the thermal oxide layer 03 may be formed on an upper and sidewall surface of the shielding polysilicon 01 by thermal oxidation or chemical vapor deposition, and is regarded as the transition oxide layer 03. Furthermore, a thickness of the transition oxide layer 03 is the same as or greater than that of the liner oxide layer 04.

Figure 2E:
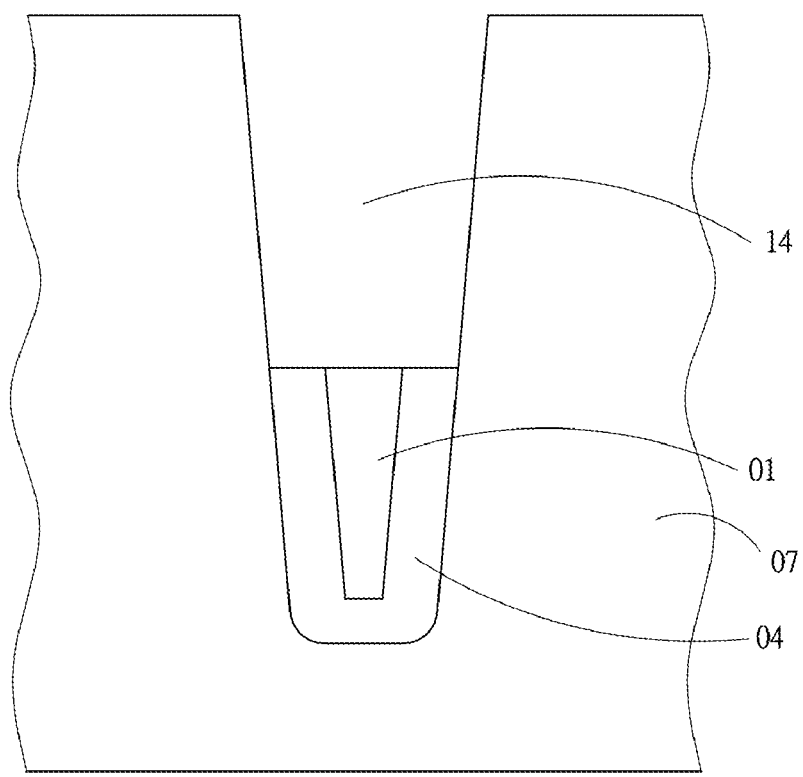
FIG. 2E shows a fifth step process of a method for forming a shielding polysilicon sidewall for protecting an SGT MOSFET according to an embodiment of the present application.

As shown in FIG. 2E, the hard mask layer 08a, the liner oxide layer 04 and the transition oxide layer 03 may be removed from a top surface of the shielding polysilicon 01 by etching (dry or wet etching techniques).

In some embodiments, the top of the heavily doped shielding polysilicon 01 may be lower than or flush with the top of the peripheral liner oxide layer 04.

In some embodiments, the thin transition oxide layer 03 is still retained on the top and sidewall of the heavily doped shielding polysilicon 01 after etching.

Figure 2F:
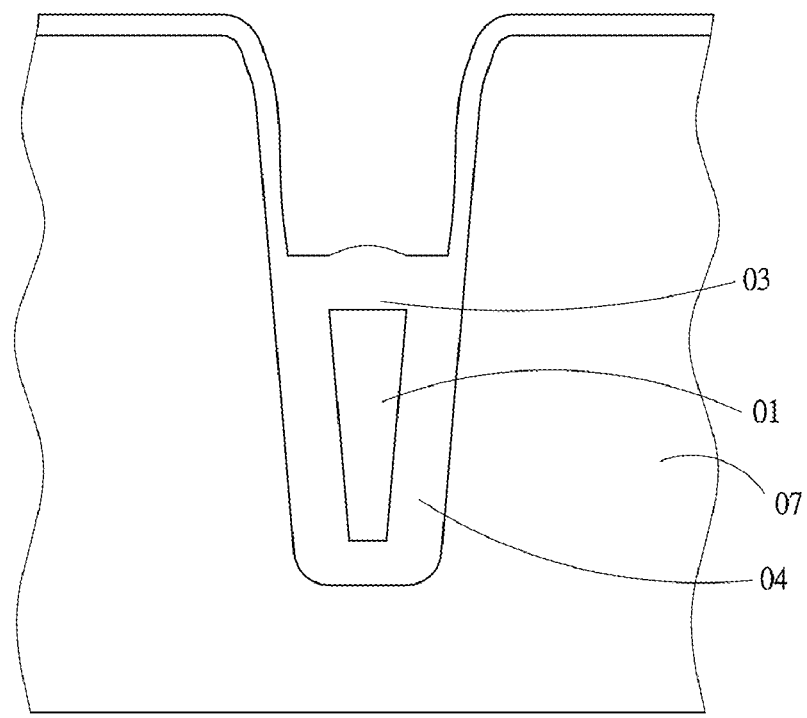
FIG. 2F shows a sixth step process of a method for forming a shielding polysilicon sidewall for protecting an SGT MOSFET according to an embodiment of the present application.

As shown in FIG. 2F, the IPO layer 11 is formed on the top surface of the heavily doped shielding polysilicon 01, the inner wall of the trench 14. In some embodiments, the IPO layer forms a plane, a notch or a protrusion on the top and sidewall surface of the shielding polysilicon 01 due to relative heights of the heavily doped shielding polysilicon 01 and the top of the liner oxide layer 04 and based on whether the transition oxide layer 03 is retained on the top of the shielding polysilicon 01.

In some embodiments, the IPO layer 11 is composed of a thermal oxide layer or a thermal oxide layer and a chemical vapor deposition oxide layer or a high-density plasma deposition oxide layer or a nitride layer mixed with a thermal oxide layer or a single nitride layer or a low-K dielectric layer.

Figure 2G:
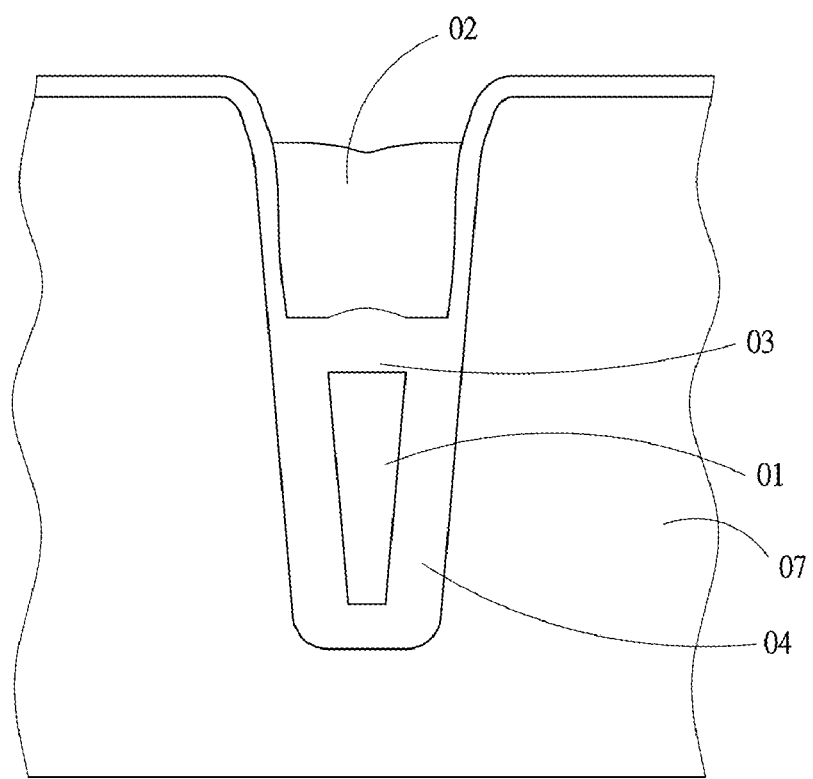
FIG. 2G shows a seventh step process of a method for forming a shielding polysilicon sidewall for protecting an SGT MOSFET according to an embodiment of the present application.

As shown in FIG. 2G, the N-type doped gate polysilicon 02 is formed above the heavily N-type doped shielding polysilicon 01, and the gate polysilicon 02 is isolated from the heavily doped shielding polysilicon 01 through the IPO layer 11. In some embodiments, the gate polysilicon 02 is formed by depositing a polysilicon layer in the opening of the trench 14 by chemical vapor deposition, and the top surface of the gate polysilicon 02 is flush with an interface between the semiconductor N-type epitaxial substrate 07 and the hard mask layer 08a on its surface.

In this case, the heavily N-type doped (doping level>2e20/$cm^3$) shielding polysilicon sidewall is formed due to this heavily N-type doped polysilicon. This polysilicon oxidation grown rate is much faster than the lightly doped N-type epitaxial layer and P-type doped body in the mesa between the trenches. This thick oxidation layer along the shielding polysilicon sidewall and trench wall forms a protection layer for avoiding gate to source Igss leakage. A subsequent transistor forming design and process depend on physical requirements of designers for elements, and no limitation is posed.

FIG. 3A to FIG. 3G are schematic diagrams of step processes of a method for forming a heavily N-type doped (doping level>2e20/$cm^3$) shielding polysilicon sidewall for protecting an SGT MOSFET according to an embodiment of the present application. The method includes at least the following steps.

Figure 3A:
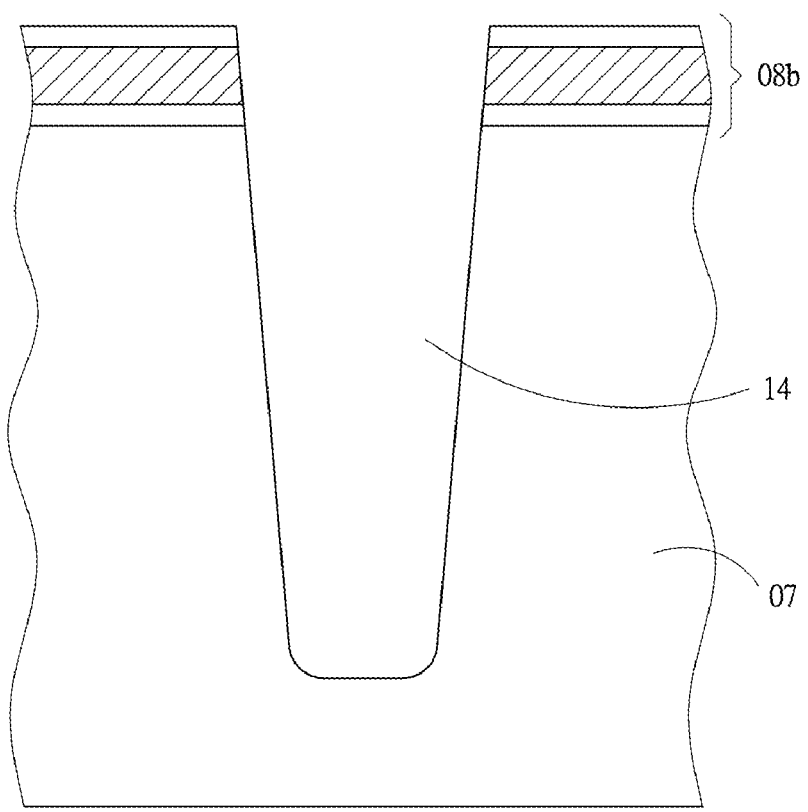
FIG. 3A shows a first step process of a method for forming a shielding polysilicon sidewall for protecting an SGT MOSFET according to an embodiment of the present application.

As shown in FIG. 3A, the trench 14 is etched on the semiconductor N-type epitaxial substrate 07 by taking a three-layer structure of oxide layer—silicon-nitrogen compound—oxide layer as a hard mask layer 08b on the surface of the semiconductor N-type epitaxial substrate 07.

Figure 3B:
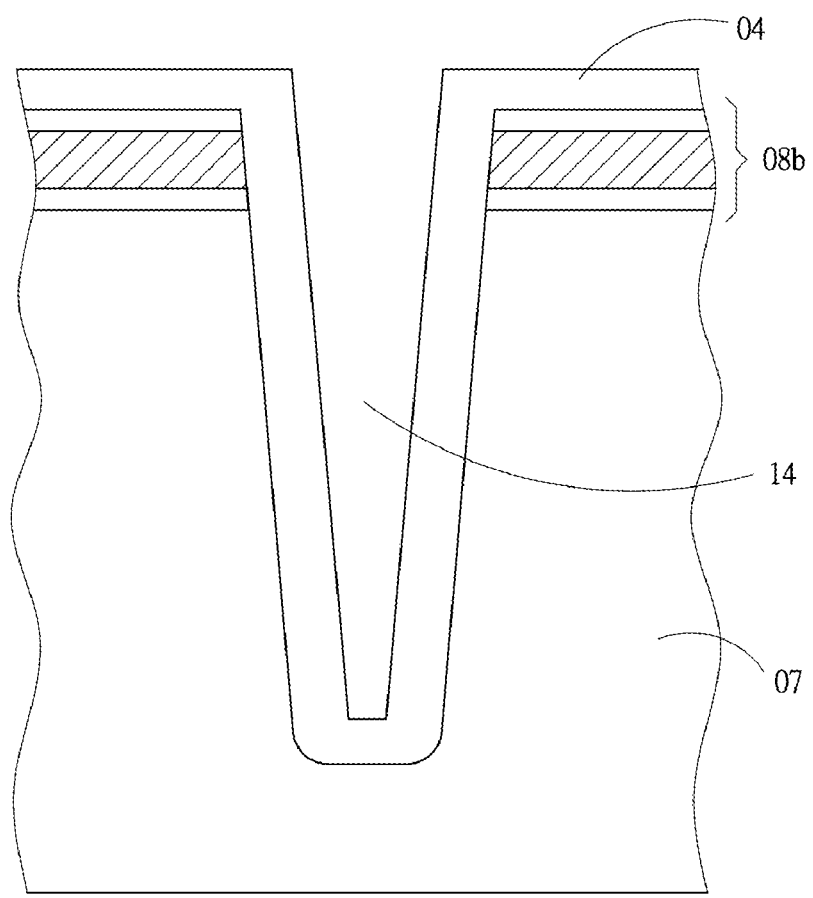
FIG. 3B shows a second step process of a method for forming a shielding polysilicon sidewall for protecting an SGT MOSFET according to an embodiment of the present application.

As shown in FIG. 3B, the liner oxide layer 04 is further formed on the sidewall of the trench 14 and a surface of the hard mask layer 08b by thermal oxidation or chemical vapor deposition, so that the sidewall of the whole trench 14 and the surface of the three-layer structure of the hard mask layer 08b are both covered by the liner oxide layer 04.

Figure 3C:
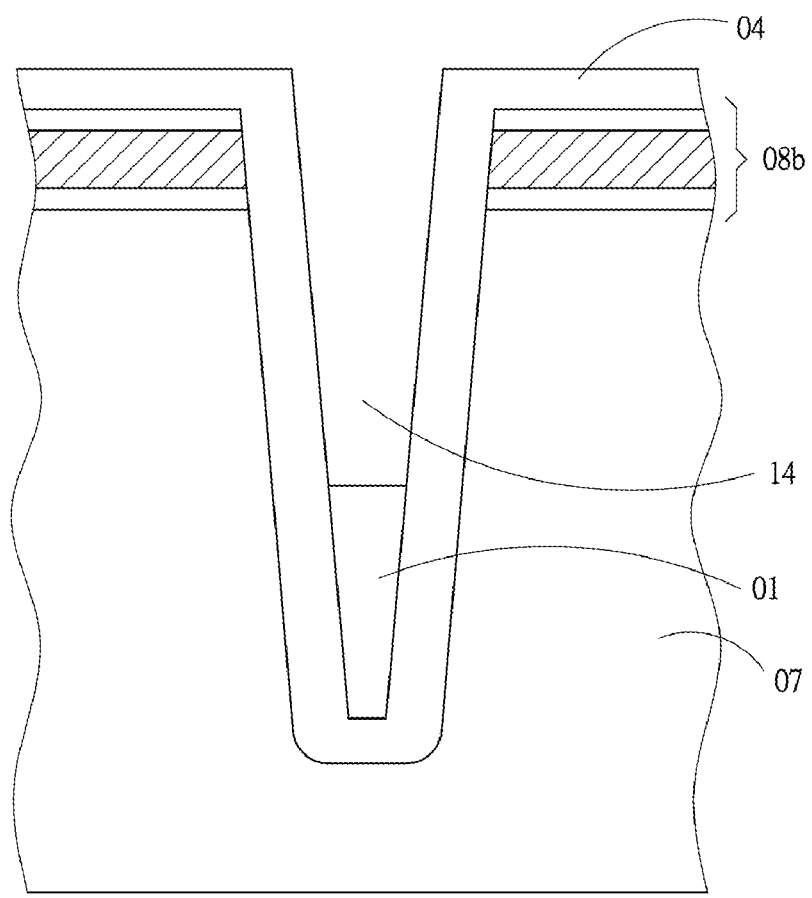
FIG. 3C shows a third step process of a method for forming a shielding polysilicon sidewall for protecting an SGT MOSFET according to an embodiment of the present application.

As shown in FIG. 3C, a heavily in situ N-type doped (doping level>2e20/cm$^3$) polysilicon layer is deposited in the space in the trench 14 by chemical vapor deposition to form the shielding polysilicon 01, and then the shielding polysilicon 01 is further etched back to retain a part of the shielding polysilicon 01 in the trench. In this case, only the part of the shielding polysilicon 01 is retained in the trench 14, leaving part of the space exposed to air to form the opening.

Figure 3D:
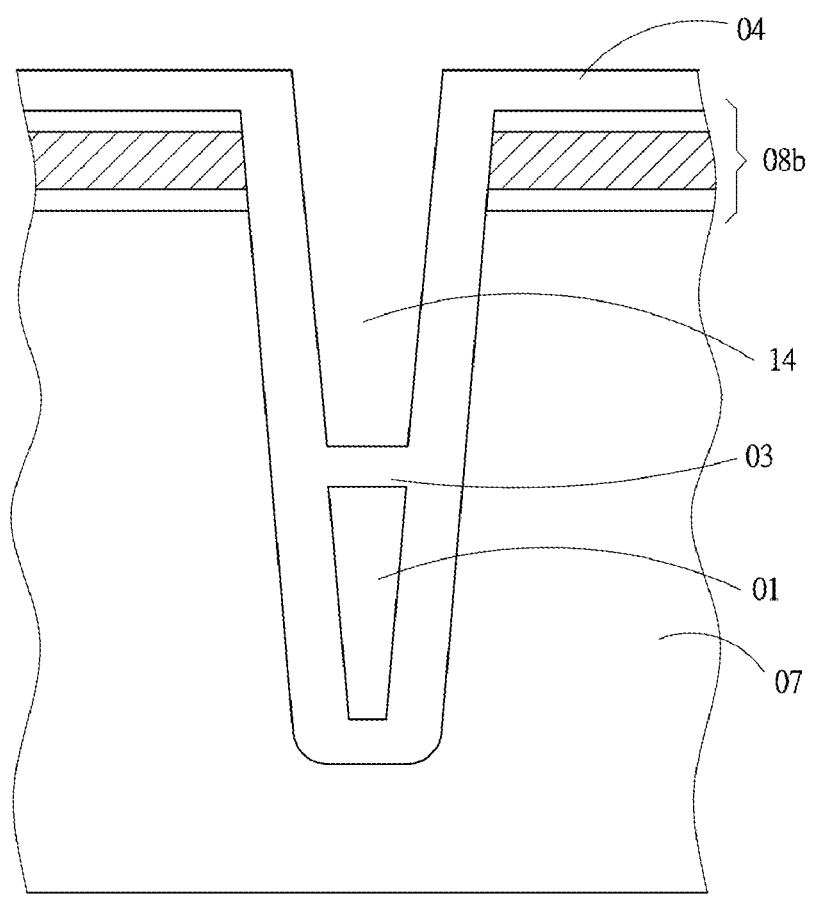
FIG. 3D shows a fourth step process of a method for forming a shielding polysilicon sidewall for protecting an SGT MOSFET according to an embodiment of the present application.

As shown in FIG. 3D, the transition oxide layer 03 (namely the thermal oxide layer) is formed on the upper and sidewall surface of the shielding polysilicon 01 by thermal oxidation or chemical vapor deposition. The shielding polysilicon sidewall with trench is protected, since the oxidation grown rate is much faster for the heavily doped polysilicon layer than that in the lightly doped mesa between trenches. This thick shielding polysilicon sidewall oxide layer still partially remain even with later on the liner oxide wet or dry etching process.

Figure 3E:
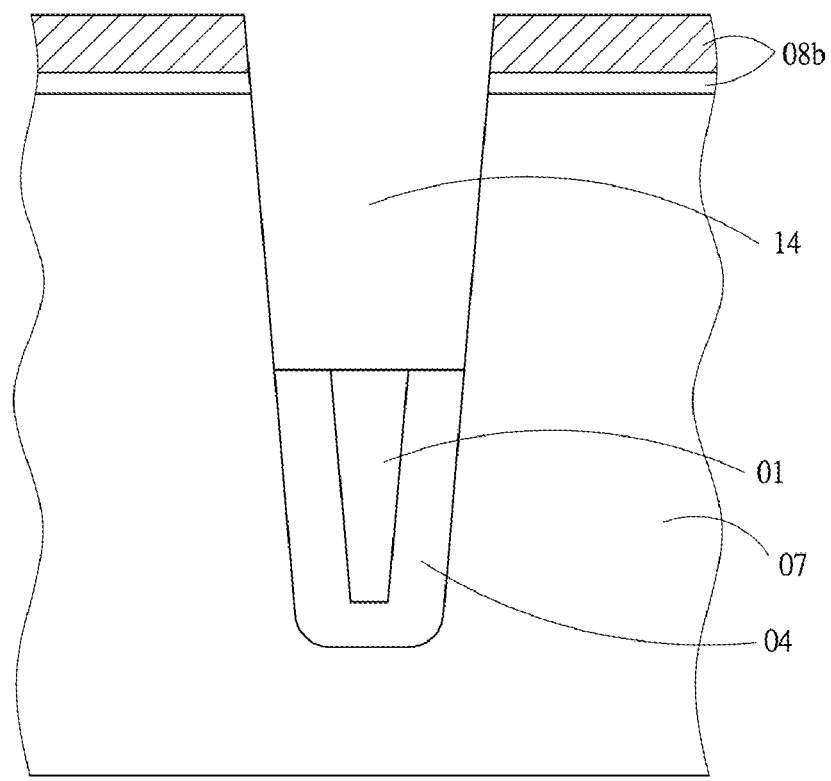
FIG. 3E shows a fifth step process of a method for forming a shielding polysilicon sidewall for protecting an SGT MOSFET according to an embodiment of the present application.

As shown in FIG. 3E, the transition oxide layer 03 is etched on the sidewall of the trench 14 and a silicon surface of the shielding polysilicon 01 to remove the oxide layer on the surface of the semiconductor substrate 07 and retain the silicon-nitrogen compound—oxide layer as the hard mask layer 08b, the liner oxide layer 04 on the top surface of the shielding polysilicon 01 and the transition oxide layer 03 to form the opening, and the top surface of the shielding polysilicon 01 is higher than the top surface of the liner oxide layer 04.

Figure 3F:
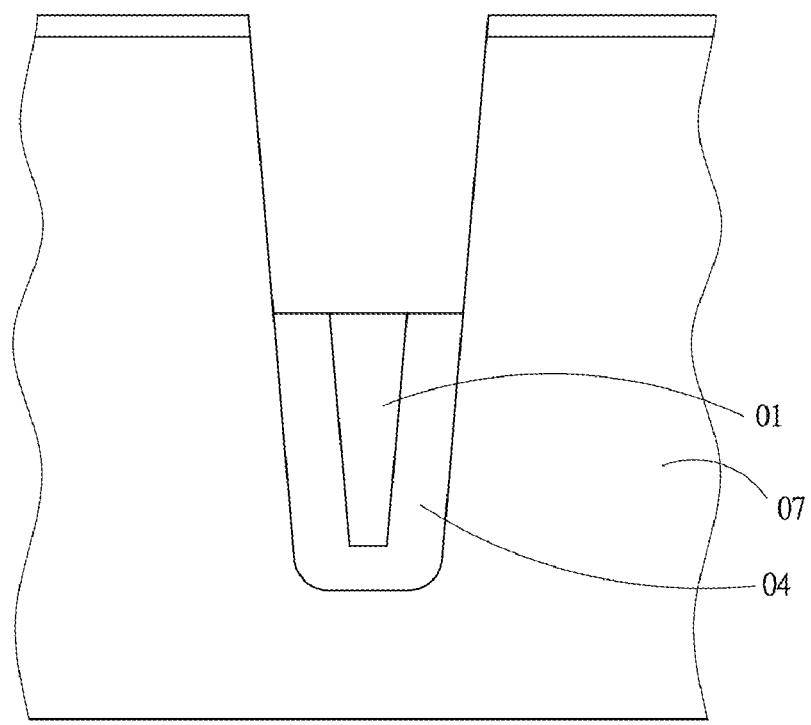
FIG. 3F shows a sixth step process of a method for forming a shielding polysilicon sidewall for protecting an SGT MOSFET according to an embodiment of the present application.

As shown in FIG. 3F, the silicon-nitrogen compound—oxide layer used as the hard mask layer 08b on the top surface of the shielding polysilicon 01 in the trench 14 and the surface of the semiconductor substrate 07 is etched to remove the silicon-nitrogen compound on the surface of the substrate and finally retain only the thin oxide layer on the surface of the substrate as the hard mask layer 08b, where the top surface of the shielding polysilicon 01 is lower than the top surface of the liner oxide layer 04.

Figure 3G:
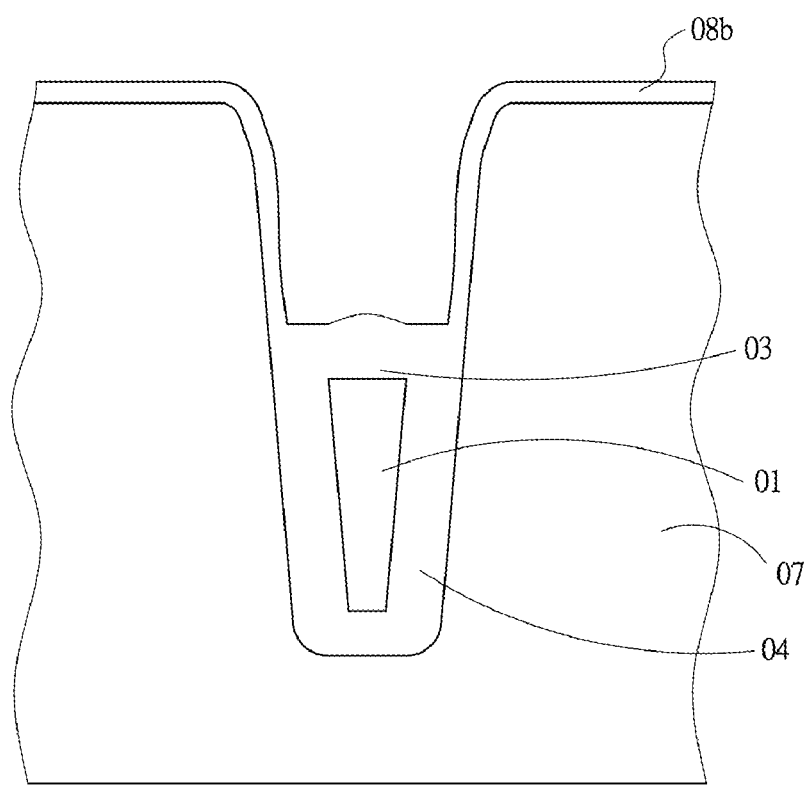
FIG. 3G shows a seventh step process of a method for forming a shielding polysilicon sidewall for protecting an SGT MOSFET according to an embodiment of the present application.

As shown in FIG. 3G, a thermal oxide layer 11 is formed on the top surface of the shielding polysilicon 01, the top surface of the liner oxide layer 04 and the inner sidewall of the trench 14. In some embodiments, the IPO layer forms a plane, a notch or a protrusion on the top surface of the shielding polysilicon 01 due to the relative heights of the shielding polysilicon 01 and the top of the liner oxide layer 04 and based on whether the transition oxide layer 03 is retained on the top of the shielding polysilicon 01.

Figure 3H:
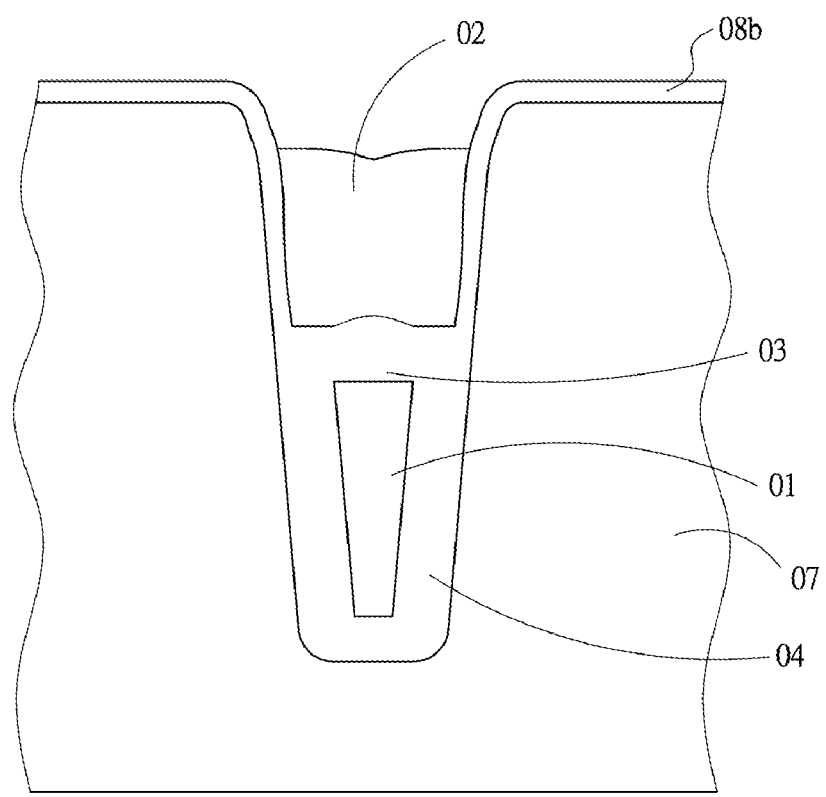
FIG. 3H shows an eighth step process of a method for forming a shielding polysilicon sidewall for protecting an SGT MOSFET according to an embodiment of the present application.

As shown in FIG. 3H, an N-type doped polysilicon layer is deposited in the opening of the trench 14 by chemical vapor deposition to form the gate polysilicon 02, and the top surface of the gate polysilicon 02 is flush with the interface between the semiconductor substrate 07 and the hard mask layer 08b on its surface.

In this case, the shielding polysilicon sidewall is formed. FIG. 3I to FIG. 3M show a subsequent transistor forming design and process, which are only for illustration, and are also suitable for continuing the processes shown in FIG. 2A to FIG. 2G. However, a physical manufacturing process of elements depends on the physical requirements of designers for the elements, and no limitation is posed.

Figure 3I:
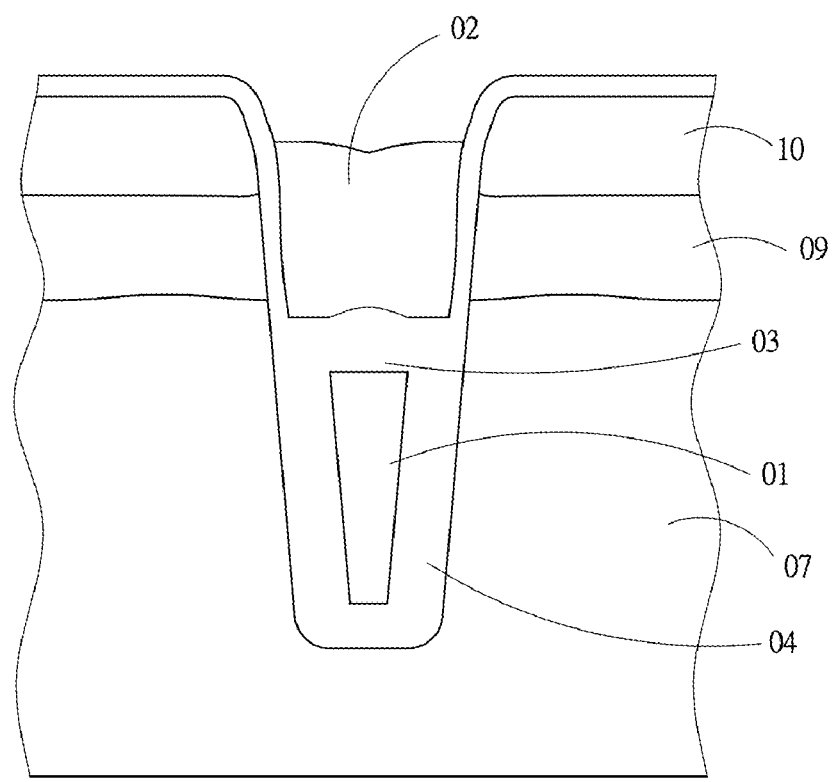
FIG. 3I shows a ninth step process of a method for forming a shielding polysilicon sidewall for protecting an SGT MOSFET according to an embodiment of the present application.

As shown in FIG. 3I, on the hard mask layer 08b on the surface of the semiconductor substrate 07, N+ doped source implantation is performed in a region of the semiconductor substrate 07 by ion implantation to form a source region 10 and P-type doped body region 09 is formed by P-type ion implantation.

Figure 3J:
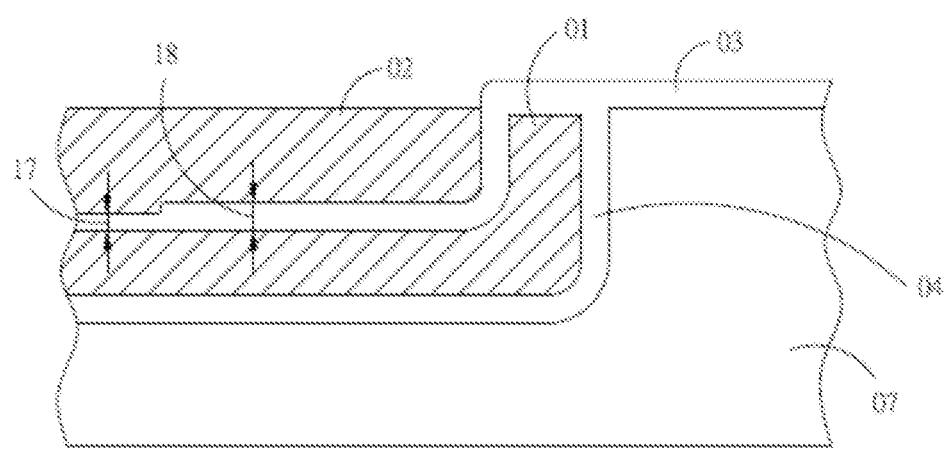
FIG. 3J is a side view of an IPO layer in a method for forming a shielding polysilicon sidewall for protecting an SGT MOSFET according to an embodiment of the present application.

As shown in FIG. 3J, a thickness of the IPO layer 11 between the shielding polysilicon 01 and the gate polysilicon 02 may be divided into a thickness d1 with a first distance 17 and a thickness d2 with a second distance 18, where the thickness d2 with the second distance 18 in a termination region 20 is greater than the thickness d1 with the first distance 17 in a core cell active region 19.

In some embodiments, the thickness of the IPO layer with the second distance in the termination region or a thickness of the shielding polysilicon contact region is 1000 Å to 3.0 μm.

In some embodiments, the IPO layer may be made by using the thermal oxidation process, where the thickness of the IPO layer with the first distance in the core cell active region is 1000 to 4000 Å.

In some embodiments, the thickness of the liner oxide layer in the trench in the termination region is 1000 Å to 3.0 μm.

Figure 3K:
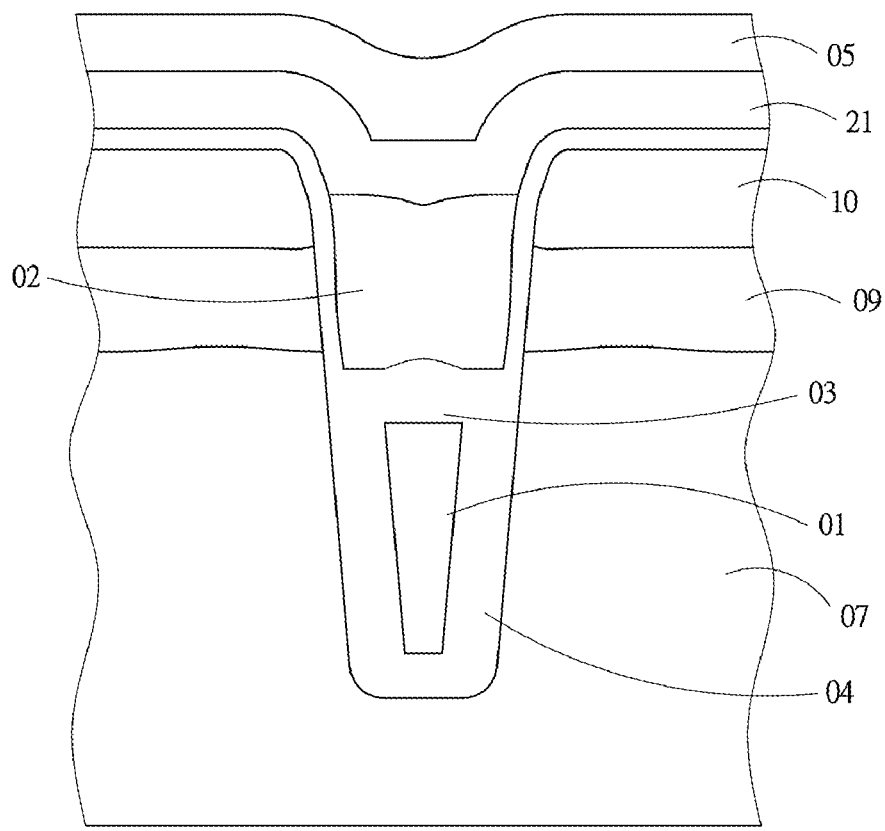
FIG. 3K shows a tenth step process of a method for forming a shielding polysilicon sidewall for protecting an SGT MOSFET according to an embodiment of the present application.

As shown in FIG. 3K, an LTO 21 and BPSG 05 are deposited on a surface of the source implantation layer 10 and the surface of the gate polysilicon 02 by chemical vapor deposition to form a BPSG oxide layer (05, 21).

Figure 3L:
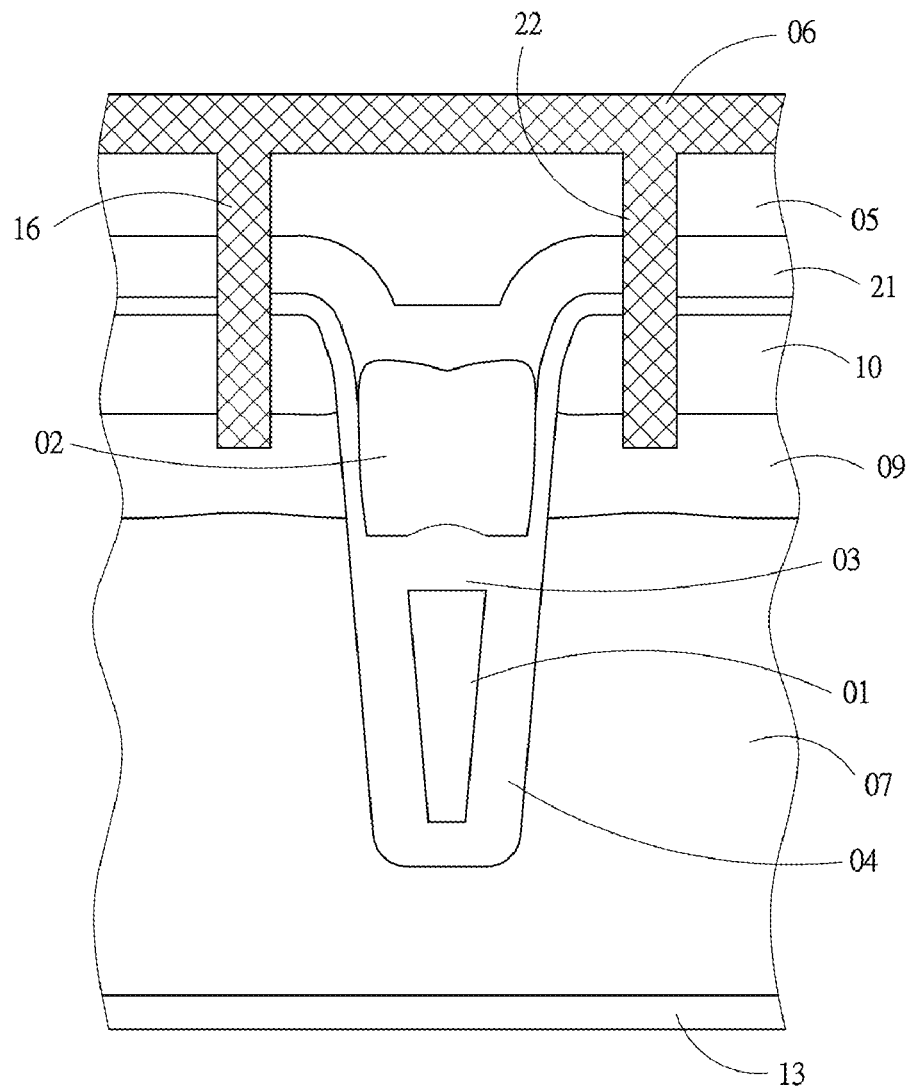
FIG. 3L shows an eleventh step process of a method for forming a shielding polysilicon sidewall for protecting an SGT MOSFET according to an embodiment of the present application.

As shown in FIG. 3L, a contact 22 is defined on a surface of the BPSG oxide layer (05, 21), and a contact 22 etching process is implemented on the BPSG oxide layer (05, 21), the source region 10 and the P-body layer 09 by the reactive ion etching process to etch a source contact 16; and finally metal tungsten is deposited in the contact 16 by metal organic chemical vapor deposition and covers the surface of the BPSG oxide layer (05, 21).

Figure 3M:
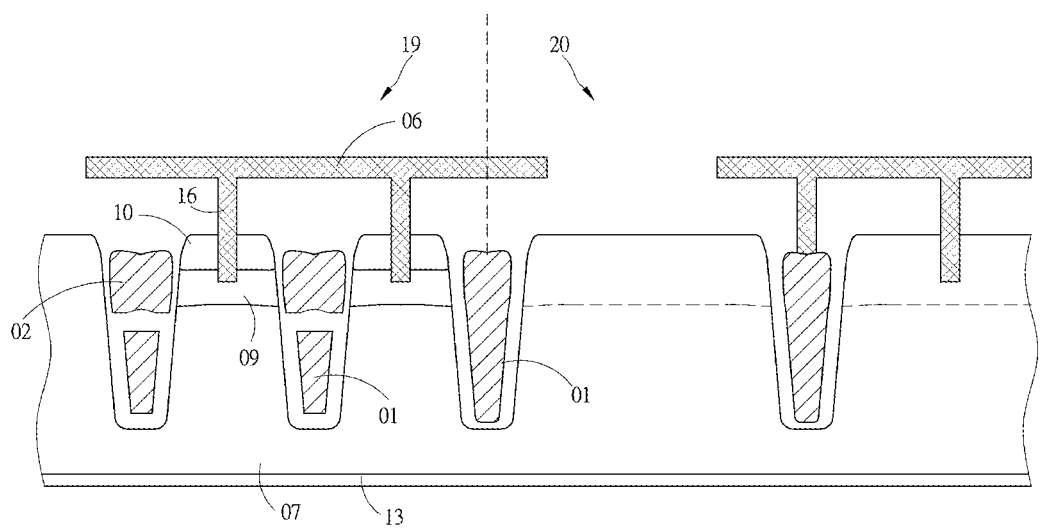
FIG. 3M shows a twelfth step process of a method for forming a shielding polysilicon sidewall for protecting an SGT MOSFET according to an embodiment of the present application.

As shown in FIG. 3M, finally, a pattern of the source metal layer 06 in the core cell active region 19 and the termination region 20 is defined.

Figure 4:
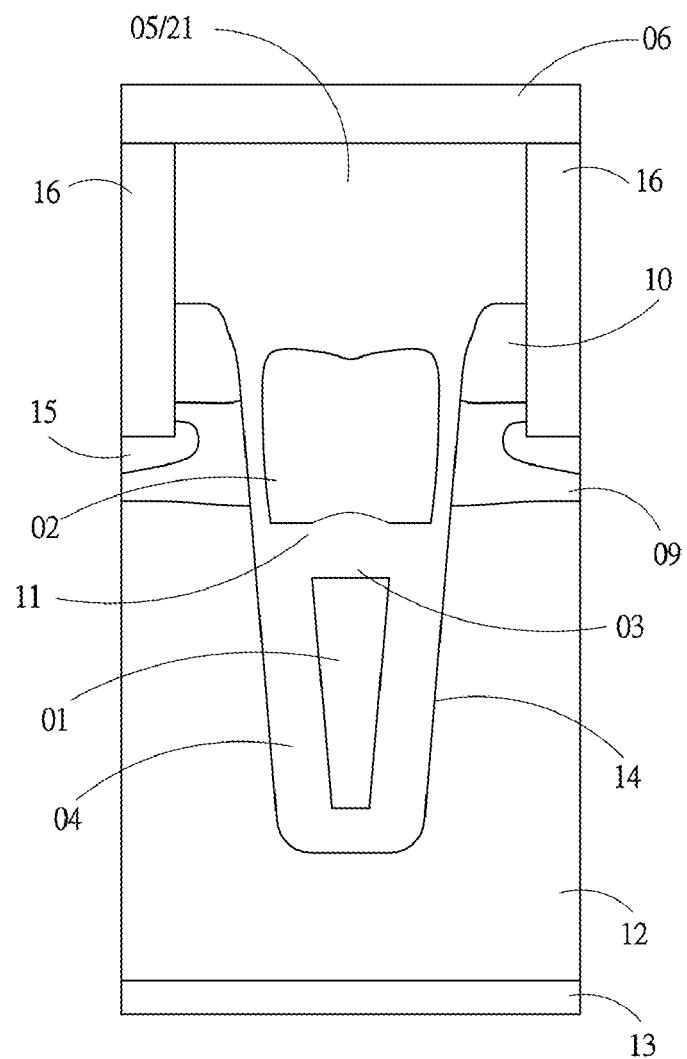
FIG. 4 is a schematic diagram of implementation of a protected SGT MOSFET structure according to an embodiment of the present invention.

FIG. 4 is a schematic diagram of implementation of an SGT MOSFET structure according to an embodiment of the present application. This embodiment is understood in combination with FIG. 4. N-type heavily doped shielding polysilicon 01 is included in a trench 14, and N-type doped gate polysilicon 02 is located above the shielding polysilicon 01 and spaced from the shielding polysilicon 01 by an IPO layer 11. On a side of the shielding polysilicon 01, there is mainly a liner oxide layer 04, while above the shielding polysilicon 01, there is mainly a thermal oxide layer 03. The top of the gate polysilicon 02 is covered by BPSG 05 and an LTO 21, and the top and a periphery of the BPSG 05 are covered by source metal 06. The source implantation layer 10 is disposed on both sides below the BPSG 05, a P-body implantation layer 09 is disposed below the source implantation layer 10, and a side of each of the P-body implantation layer 09 is provided with a P+ contact implantation 15.

In an embodiment of the present invention, P-body implantation is performed in the termination region 20 as well for low breakdown voltage such as BVdss<80V. P-body implantation should be avoided in the termination region for the breakdown voltage BVdss>80V for the drain to source leakage consideration.

In an embodiment of the present invention, P-body implantation is performed in the termination region 20, for a MOSFET device with a breakdown voltage less than 80 V, it is unnecessary to add a trench 14 guard ring to reduce drain-to-source electric leakage. For a MOSFET device with a breakdown voltage greater than 80 V, it is necessary to add a trench 14 guard ring to reduce drain-to-source electric leakage.

In an embodiment of the present invention, P-body implantation is not performed in the termination region 20, and for a MOSFET device with a breakdown voltage BVdss>80V, it is unnecessary to add a trench 14 guard ring to reduce drain-to-source electric leakage for charge balanced SGT MOSFET. For an SGT MOSFET device with a breakdown voltage BVdss>80V, it is necessary to add a trench 14 guard ring to reduce drain-to-source electric leakage for partial charge balanced SGT MOSFETs.

In an embodiment of the present application, a breakdown voltage executed on the SGT MOSFET is between 10 V and 300 V.

In the present invention, a thickness of a region between the top of the shielding polysilicon and the gate polysilicon, namely the thickness of the IPO layer, and a thickness of an oxide of the trench sidewall in the transition region between the shielding polysilicon and the gate polysilicon are increased due to the heavily N-type doped (>20e20/cm$^3$) shielding polysilicon, so that a gate-to-source leakage current and a drain-to-source leakage current can be reduced, and service lives of elements are prolonged.

Terms such as "in an embodiment of the present application" and "in various embodiments" are used repeatedly. The terms usually do not refer to the same embodiment, but they may refer to the same embodiment. The words such as "including", "having" and "comprising" are synonyms unless the context shows other meanings.

The above is only specific embodiments of the present application and is not intended to limit the present application in any form. Although the present application has been disclosed by the specific embodiments above, the embodiments are not intended to limit the present application. Any person skilled in the art may make some changes or modifications to implement equivalent embodiments with equivalent changes by using the technical content disclosed above without departing from the scope of the technical solution of the present application. Any simple modification, equivalent change and modification made to the foregoing embodiments according to the technical essence of the present application without departing from the content of the technical solution of the present application shall fall within the scope of the technical solution of the present application.

What is claimed is:

1. A method for forming a shielding polysilicon sidewall for protecting a shielded gate trench metal-oxide-semiconductor field effect transistor (SGT MOSFET), comprising:
    forming a heavily N-type doped semiconductor substrate with an N-type epitaxial layer to form an semiconductor N-type epitaxial substrate and forming a trench on a surface of the semiconductor N-type epitaxial substrate;
    forming a liner oxide layer on an inner wall of the trench;
    arranging a heavily N-type doped (>2e20/cm$^3$) shielding polysilicon in the trench, the heavily N-type doped shielding polysilicon not being in contact with the source metal layer;
    forming a transition oxide layer on a top and sidewall surface of the heavily N-type doped shielding polysilicon;
    removing the liner oxide layer and the transition oxide layer from a top surface of the heavily N-type doped shielding polysilicon, while keeping some remaining transition oxide layer on the sidewall of the heavily N-type doped shielding polysilicon;
    forming an inter-polysilicon oxide (IPO) layer on the top surface of the heavily N-type doped shielding polysilicon, the inner wall of the trench; and
    forming an N-type doped gate polysilicon above the heavily N-type doped shielding polysilicon, the N-type doped gate polysilicon being isolated from the heavily N-type doped shielding polysilicon through the IPO layer.

2. The method for forming a shielding polysilicon sidewall for protecting an SGT MOSFET according to claim 1, wherein when the heavily N-type doped shielding polysilicon is arranged in the trench, an in situ heavily N-type doped (>2e20/cm$^3$) polysilicon is deposited in the trench, and the polysilicon is etched back to retain some materials to form the heavily N-type doped shielding polysilicon.

3. The method for forming a shielding polysilicon sidewall for protecting an SGT MOSFET according to claim 1, wherein when the heavily N-type doped shielding polysilicon is arranged in the trench, an in situ heavily N-type doped (>2e20/cm$^3$) polysilicon is deposited in the trench, and the poly silicon is etched back to retain some materials to form the shielding polysilicon.

4. The method for forming a shielding polysilicon sidewall for protecting an SGT MOSFET according to claim 1, wherein the liner oxide layer and the transition oxide layer on the top surface of the heavily N-type doped shielding polysilicon are removed by the reactive ion plasma dry etching or a wet etching technique.

5. The method for forming a shielding polysilicon sidewall for protecting an SGT MOSFET according to claim 1, wherein thicknesses of the transition oxide layer and the liner oxide layer are the same or different.

6. The method for forming a shielding polysilicon sidewall for protecting an SGT MOSFET according to claim 1, wherein the liner oxide layer for the protective shielding polysilicon sidewall is makeable by using a thermal oxidation process or thermal oxidation and a chemical vapor deposition process.

7. The method for forming a shielding polysilicon sidewall for protecting an SGT MOSFET according to claim 1, wherein the IPO layer is composed of a thermal oxide layer or a thermal oxide layer and a chemical vapor deposition oxide layer or a high-density plasma deposition oxide layer or a nitride layer mixed with a thermal oxide layer or a single nitride layer or a low-K dielectric layer.

8. The method for forming a shielding polysilicon sidewall for protecting an SGT MOSFET according to claim 1, wherein the liner oxide layer of the protective shielding polysilicon sidewall is located between the heavily N-type doped shielding polysilicon and the trench sidewall, and the IPO layer of the protective shielding polysilicon sidewall is located between the shielding polysilicon sidewall and the gate polysilicon, comprising: a first distance and a second distance, wherein the IPO layer further comprises a termination region and a core cell active region.

9. The method for forming a shielding polysilicon sidewall for protecting an SGT MOSFET according to claim 8, wherein a thickness of the IPO layer with the second distance in the termination region is greater than a thickness of the IPO layer with the first distance in the core cell active region.

10. The method for forming a shielding polysilicon sidewall for protecting an SGT MOSFET according to claim 8, wherein the IPO layer is makeable by using the chemical vapor deposition process, and the thickness of the IPO layer with the second distance in the termination region or a thickness of a shielding polysilicon contact region is 1000 Å to 3.0 μm.

11. The method for forming a shielding polysilicon sidewall for protecting an SGT MOSFET according to claim 8, wherein the IPO layer is makeable by using the thermal oxidation process, and the thickness of the IPO layer with the first distance in the core cell active region is 1000-4000 Å.

12. The method for forming a shielding polysilicon sidewall for protecting an SGT MOSFET according to claim 1, wherein the heavily N-type doped shielding polysilicon is extensible to the trench top surface of the substrate in the termination trench region.

13. The method for forming a shielding polysilicon sidewa II for protecting an SGT MOSFET according to claim 1, further comprising:
- forming a P-type implanted body region and a heavily N-type implanted source region on the surface of the semiconductor N-type epitaxial substrate;
- forming an LTO and a boron-phosphorosilicate glass (BPSG) oxide layer on a surface of a source implantation region and a surface of a gate polysilicon region;
- defining a contact on a surface of the LTO and the BPSG oxide layer;
- forming a source contact on the LTO and the BPSG oxide layer for connecting a source region and a P-type body region;
- and a shield polysilicon contact for connecting the heavily N-type doped shielding polysilicon to the source metal layer;
- and a gate polysilicon contact for connecting the gate polysilicon to a gate metal layer; and forming the source metal layer and the gate metal layer on the surface of the LTO and the BPSG oxide layer.

\* \* \* \* \*